United States Patent
Toth et al.

(10) Patent No.: US 8,598,542 B2
(45) Date of Patent: Dec. 3, 2013

(54) CHARGED PARTICLE BEAM PROCESSING

(75) Inventors: Milos Toth, Portland, OR (US); Richard J. Young, Beaverton, OR (US); Alexander Henstra, Utrecht (NL); Alan Frank de Jong, Eindhoven (NL); Johannes Jacobus Lambertus Mulders, Eindhoven (NL)

(73) Assignee: FEI Company, Hillsboro, OR (US)

( * ) Notice: Subject to any disclaimer, the term of this patent is extended or adjusted under 35 U.S.C. 154(b) by 918 days.

(21) Appl. No.: 12/719,619

(22) Filed: Mar. 8, 2010

(65) Prior Publication Data
US 2010/0224592 A1    Sep. 9, 2010

Related U.S. Application Data

(60) Provisional application No. 61/158,220, filed on Mar. 6, 2009.

(51) Int. Cl.
*G21G 4/00*    (2006.01)

(52) U.S. Cl.
USPC ............. 250/492.1; 420/492.2; 420/492.3

(58) Field of Classification Search
USPC .......................................... 250/492.1–492.3
See application file for complete search history.

(56) References Cited

U.S. PATENT DOCUMENTS

| | | | |
|---|---|---|---|
| 3,622,781 A | 11/1971 | Liebl | |
| 4,902,530 A | 2/1990 | Yasaka et al. | |
| 5,221,844 A | 6/1993 | van der Mast et al. | |
| 5,683,547 A | 11/1997 | Azuma et al. | |
| 5,827,786 A * | 10/1998 | Puretz | 438/789 |
| 6,395,347 B1 | 5/2002 | Adachi et al. | |
| 6,838,380 B2 | 1/2005 | Bassom et al. | |
| 7,034,315 B2 | 4/2006 | Henstra et al. | |
| 7,060,196 B2 | 6/2006 | Makarov et al. | |
| 7,238,294 B2 | 7/2007 | Koops et al. | |
| 7,504,182 B2 | 3/2009 | Stewart et al. | |
| 7,537,708 B2 | 5/2009 | Peter Koops et al. | |
| 7,883,630 B2 | 2/2011 | Makarov et al. | |
| 2003/0168606 A1 | 9/2003 | Adamec et al. | |
| 2007/0158589 A1* | 7/2007 | Bertsche et al. | 250/492.2 |
| 2007/0278418 A1* | 12/2007 | Zani et al. | 250/432 R |
| 2008/0088831 A1 | 4/2008 | Mulders et al. | |
| 2010/0032302 A1 | 2/2010 | Holtermann et al. | |

(Continued)

FOREIGN PATENT DOCUMENTS

DE    4337309    3/1995
WO    WO9738355    10/1997

OTHER PUBLICATIONS

Lobo, Charlene J., et al., 'High Resolution Radially Symmetric Nanostructures from Simultaneous Electron Beam Induced Etching and Deposition,' Nanotechnology, 2008, 6 pages, vol. 19.

(Continued)

*Primary Examiner* — Michael Maskell
(74) *Attorney, Agent, or Firm* — Scheinberg & Associates, PC; Michael O. Scheinberg; John B. Kelly

(57) ABSTRACT

Electron-beam-induced chemical reactions with precursor gases are controlled by adsorbate depletion control. Adsorbate depletion can be controlled by controlling the beam current, preferably by rapidly blanking the beam, and by cooling the substrate. The beam preferably has a low energy to reduce the interaction volume. By controlling the depletion and the interaction volume, a user has the ability to produce precise shapes.

8 Claims, 6 Drawing Sheets

(56) References Cited

U.S. PATENT DOCUMENTS

| | | |
|---|---|---|
| 2010/0032567 A1 | 2/2010 | Maclou Botman et al. |
| 2010/0159370 A1 | 6/2010 | Jong et al. |
| 2010/0197142 A1 | 8/2010 | Randolph et al. |
| 2011/0115129 A1 | 5/2011 | Straw et al. |

OTHER PUBLICATIONS

Plies, Erich, et al., 'Proposal of Novel Highly Symmetric Wien Filter Monochromator,' Microscopy and Microanalysis, 2003, pp. 28-29, vol. 9.

Scipioni, Larry, et al., 'Applications of the Helium Ion Microscope,' Microscope Today, Nov. 2007, pp. 12-15.

Toth, Milos, et al., 'Electron Flux Controlled Switching Between Electron Beam Induced Etching and Deposition,' Journal of Applied Physics, 2007, 6 pages, vol. 101.

Uhlemann, S., et al., 'Experimental Set-Up of a Fully Electrostatic Monochromator for a 200 kV TEM,' Proceedings of the 15th International Congress on Electron Microscopy, session 5/S14, Sep. 1-6, 2002, 2 pages.

Won, You-Yeon, 'Imaging Nanostructured Fluids Using Cryo-TEM,' Korean J. Chem. Eng., 2004, pp. 296-302, vol. 21, Iss. 1.

Benner, Gerd, et al., 'Design and First Results of SESAM,' LEO Elektronenmikroskople GmbH, 2 pages.

Boszo, F., et al., 'Electronic Excitation-Induced Surface Chemistry and Electron-Beam-Assisted Chemical Vapor Deposition,' Mat. Res. Soc. Symp. Proc., 1990, pp. 201-209, vol. 158.

Braun, Alexander E., 'Does SEM Have a Future?,' Semiconductor International, Dec. 2007, 1 page.

\* cited by examiner

CHARGED PARTICLE BEAM PROCESSING

This application claims priority from U.S. Provisional Application No. 61/158,220, filed on Mar. 6, 2009, which is hereby incorporated by reference.

TECHNICAL FIELD OF THE INVENTION

The present invention relates to charged particle beam processing for producing fine structures using a charged particle beam, and an apparatus for performing said charged particle beam processing.

BACKGROUND OF THE INVENTION

A scanning electron microscope forms an image of a sample by detecting electrons emitted from the sample as the beam scans the sample surface. A scanning electron microscope can also alter a sample by inducing a chemical reaction on the surface as the beam scans across the surface. For example, electrons in the beam can initiate a reaction of a gaseous precursor adsorbate, which can decompose to deposit material onto the surface or can etch the sample surface by combining with the surface material to form a volatile compound, which is eventually removed by the vacuum pump. The beam can also initiate a reaction directly in the sample, such as when an electron beam is used to expose a photoresist.

The resolution of electron beam processing, whether in imaging or inducing a reaction, depends in part upon the diameter of the beam as it impacts the surface. The smaller the electron beam diameter, the smaller the region from which secondary electrons will be emitted for imaging or the smaller the region that will be chemically altered.

As electrons in the primary beam impact the sample surface, they can cause the emission of other electrons, referred to as secondary electrons. The primary electrons also penetrate below the sample surface, and are backscattered from the sample. The depth of penetration and the number of backscattered electrons depend on the energy of the electrons in the primary beam and on the sample material. Backscattered electrons that return to the surface can cause the emission of additional secondary electrons, referred to as "type II" secondary electrons. Because of the scattering of the primary beam electrons in the sample, the secondary electrons and backscattered electrons are emitted from a surface area that is larger than the area of the primary beam impact, thereby reducing the resolution of electron beam processing. Secondary electron transport inside the sample prior to emission also broadens the area from which the secondary electrons are emitted from the surface.

The beam spot size is also limited by several types of aberration, the largest of which in many applications is chromatic aberration. Electrons coming from the source do not all have the same energy, and the chromatic aberration occurs because the lenses in the focusing column focus electrons having different energies at different places. One way to reduce the chromatic aberration is to use a small aperture in the beam path that stops electrons that are not tightly focused, thereby eliminating electrons having energies that deviate by a certain amount from the mean beam energy. Unfortunately, as the aperture gets smaller, diffraction effects caused by the aperture increase and cause the beam to spread out. Thus, as one reduces the chromatic aberration, one increases the beam spread due to diffraction.

It has been considered that scanning electron microscopes were reaching their limits of usefulness as microstructures were produced in the sub-10 nanometer range. In "Does SEM Have a Future?", *Semiconductor International*, Dec. 27, 2007, Senior Editor Alexander E. Braun questions whether SEMs will be useful as structures are formed having dimensions of tens of nanometer and smaller. The article suggests that the trade offs between a large convergence angle to reduce diffraction effects and a small convergence angle to reduce chromatic aberration appeared to limit the usefulness of an SEM for structures in the nanometer range. Dr. Braun suggests two alternatives to extend the usefulness of SEMs: Use of aberration correction or use of higher energies. According to Dr. Braun, aberration correctors are complex devices with forty eight or sixty four active elements, and an exceeding small depth of field. It is known that many of the settings on the numerous active elements of the correctors are specific to a particular beam condition; minor changes in the beam parameters require time-consuming adjustments of many elements. While an aberration correction can be used to obtain high resolution images in a research environment, the requirement to readjust the many elements for any change in the imaging conditions makes aberration correctors impractical for routine SEM operation.

One proposed solution is to use helium ions, instead of electrons, because the helium ions have a shorter wavelength and therefore have smaller diffraction effects. Helium ions, however, are much heavier than electrons and cause more damage to the sample. Furthermore, helium ion microscopy is an immature technology with reliability problems that inhibit applications beyond research in light ion microscopy.

One application for electron beams is to initiate a chemical reaction of gaseous precursor molecules adsorbed on a sample surface to etch a sample or to deposit a material on a sample. The use of a charged particle beam to initiate a chemical reaction with a precursor is referred to as "beam chemistry." For many applications, it is desirable to be able to use beam chemistry to fabricate high aspect ratio structures, that is, structures that are relatively deep or tall compared to their width. There are multiple competing mechanisms inherent in the charged particle beam deposition process that tend to broaden the structures produced, thereby reducing the aspect ratio.

Electrons are emitted from the sidewalls of the structures being fabricated upon impact of the primary electron beam. These electrons decompose the precursor adsorbates and cause etching or deposition on the sides of structures, making holes and deposited structures wider. The literature shows numerous results pointing to improvements in aspect ratio with increasing beam energy.

The aspect ratio of structures fabricated by beam chemistry is also affected by precursor adsorbate depletion. Depletion occurs because precursor adsorbates are consumed in the chemical reactions that cause etching or deposition, and the adsorbates are replenished at a finite rate given by the local precursor arrival rate at the sample surface. Depletion affects nanostructure aspect ratios because the electron flux that causes depletion is not constant across the sample surface. The electron flux has a maximum at the electron beam axis, and decreases with increasing distance from the beam axis. In particular, the electron flux is typically relatively low at the sidewalls and relatively high at the top surface of a structure being grown by beam chemistry. Hence, adsorbate depletion is greatest at the top surface, as is the consequential suppression of the vertical growth rate. Preferential suppression of the vertical growth rate causes a reduction in the aspect ratio of a structure grown by beam chemistry.

Thus, the industry requires a practical system for producing fine structures using a charged particle beam.

SUMMARY OF THE INVENTION

An object of the invention is to provide an electron beam system for producing fine structures using a charged particle beam.

Embodiments of the present invention improve charged particle beam deposition and gas assisted etching by controlling adsorbate depletion, and the electron beam energy and diameter. Other embodiment provide charged particle beam system to provides a low chromatic aberration, low energy beam that is suitable for charged particle processing.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings.

DETAILED DESCRIPTION OF PREFERRED EMBODIMENTS

Figure 1:
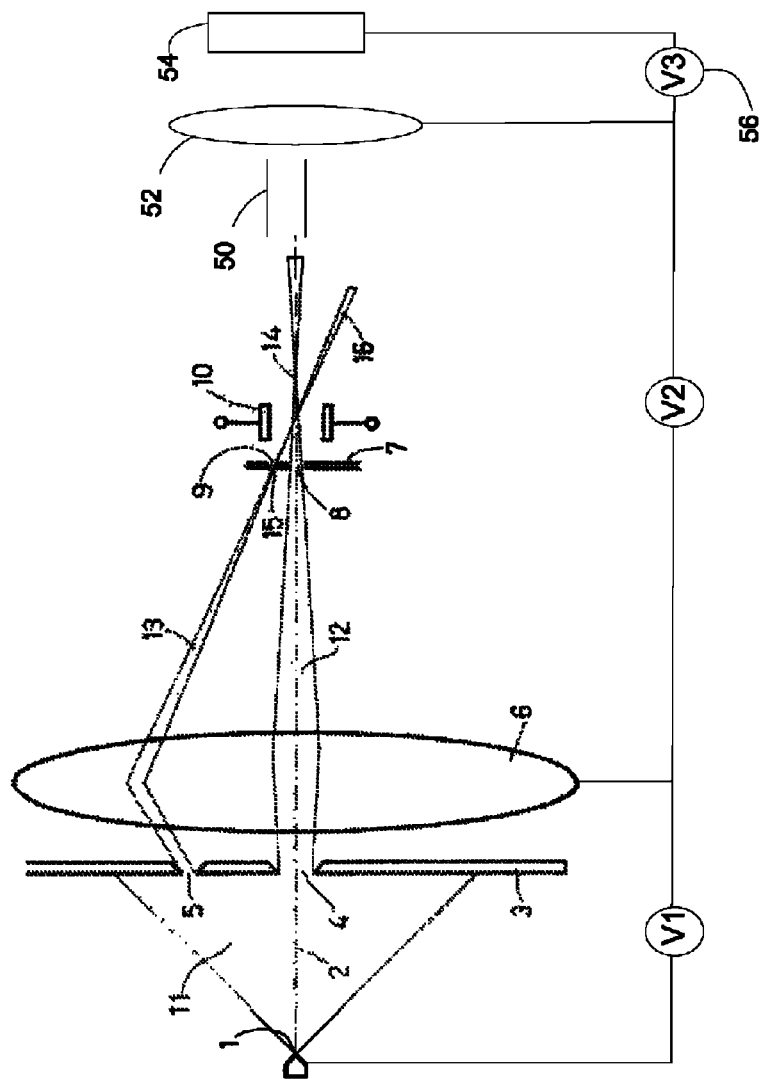
FIG. 1 shows an electron beam system as described that produces a low energy, low chromatic aberration beam

While the literature points to using increased beam energy to produce finer structures, applicants believe that these results come about because of complex growth kinetics and adsorbate depletion effects. In electron beam initiated deposition, lateral process resolution is limited by electron emission from sidewalls, which is affected by the size of the interaction volume. Applicants believe that a combination of low beam energy and adsorbate depletion control ultimately yield superior resolution for beam-induced processing.

Charged particle beam-induced growth can be thought of in terms of two components—a vertical component driven by electrons in the vicinity of the electron beam, and an undesirable horizontal component driven by electrons emitted from deposit sidewalls. Similarly, etching has an analogous vertical component, and a horizontal component driven by electrons that are emitted/reflected from the base of the pit and strike the etch pit sidewalls. The horizontal components cause broadening of the structures fabricated, limiting the resolution and aspect ratios.

The undesirable horizontal component is caused primarily by a delocalized process often referred to as "overspray". The bulk of overspray is caused by a combination of primary electrons scattered by gas molecules; backscattered and secondary electrons emitted from the sample, and recollected electrons originating at deposit or etch pit sidewalls. The use of low energy beams reduces the problem of backscattered electrons, secondary electrons, and type II secondary electrons, but enhances the contribution due to beam scatter in the gas.

Deposition and etch process rates are modulated by the extent of precursor adsorbate depletion at the sample surface. Depletion occurs because precursor adsorbates are consumed in the chemical reactions that cause etching or deposition, and the adsorbates are replenished at a finite rate given by the precursor pressure at the sample surface, and the precursor molecule sticking coefficient, adsorption time and diffusion coefficient at the sample surface. Depletion can be defined by $D=C/C_0$, where $C$=local adsorbate concentration and $C_0$=C in the absence of electron irradiation. D scales directly with local electron flux, and inversely with the rate of adsorbate arrival (occurring through gas adsorption and adsorbate diffusion). The local process (etch or deposition) rate at a given point on the sample surface scales inversely with D at that point on the sample surface.

The vertical and horizontal growth rate components discussed above are driven by the local electron flux under the beam and at nanostructure sidewalls, respectively. The electron flux at the sidewalls is typically lower than under the beam, and so D is typically greater under the beam than at the sidewalls. That is, an increase in beam current has the effect of preferentially increasing D under the beam, thereby preferentially increasing the horizontal growth rate, resulting in broader structures. The preferential increase in D under the beam can be alleviated by decreasing the beam current or by increasing the precursor gas pressure near the sample surface. Both of these approaches improve the ratio of vertical to horizontal growth. However, both of these approaches have disadvantages. An increase in pressure increases the extent of electron beam scattering by the gas. The use of a low beam current has the disadvantage of a poor signal-to-noise ratio for imaging. Imaging is needed to focus the beam prior to processing. Imaging is also needed for navigation prior to processing and inspection of the structures grown by beam chemistry.

In a preferred embodiment, applicants modulate D by altering the beam current during etching or deposition. Beam current is typically controlled by changing the size of an aperture in the beam path. An aperture having a smaller hole lets less current pass by blocking electrons that are further from the beam axis. Apertures are typically formed as holes in an aperture strip that can be mechanically moved to place apertures of different sizes in the beam path. Because changing apertures typically requires mechanically moving and centering an aperture, it requires electron imaging and takes time. The beam current can also be controlled by changing the excitation of a condenser lens that controls the beam diameter in the plane of the aperture. However, a change in condenser lens excitation also alters the electron beam diameter at the sample surface, which must subsequently be re-focused by adjusting an objective lens. The latter requires electron imaging and takes time. In a preferred embodiment of the invention, the beam current is controlled by using rapid blanking and unblanking of the beam, that is, interrupting the beam above the sample so as to modulate the fraction of electrons that reach the sample. By rapidly blanking and unblanking the beam, a user can control the beam current. It is preferred to blank the beam in a manner that prevents the beam from sweeping across the sample as it is blanked. There are several blanking techniques that accomplish this, and those techniques are loosely referred to as "conjugate blanking" techniques. Conjugate blanking techniques include positioning electrostatic blanking plates at a crossover point of the electron beam or using double deflection to cancel out electron beam motion in the plane of the sample. Skilled persons will understand that such techniques are not perfect and some slight deflection does take place in the plane of the sample because of non-ideal, real-world phenomena such as the transit time of electrons through blanking plates and fringe electric fields around the plates.

Controlling the beam current using blanking provides several advantages:

1. The beam current can be modulated independently of the beam diameter at the sample surface, which
   a. eliminates structural distortions caused by changes in beam diameter during growth; and
   b. provides the ability to switch during processing between a "high" beam current (in the absence of blanking) for ergonomic focusing, imaging, and navigation, and lower currents (using fast blanking and unblanking), without requiring re-focusing,
2. The objective lens can be used for slow focus corrections during processing that may be needed for the fabrication of high aspect ratio structures limited by the depth of field of the SEM.

Beam chemistry activation cross-sections, that is, the probability that an incoming electron will cause a reaction, typically maximize around 100 eV. The "effective" cross-section for a given process is a function of the secondary and backscattered electron yields, and the energy distributions of the primary, backscattered and secondary electrons. A highly focused, low energy beam is desirable for some high efficiency, high resolution processes. In general, scattering of the primary electron beam by the (precursor) gas molecules increases roughly exponentially with decreasing beam energy. Scattering of very low energy beams will be problematic at very low beam energies (e.g., <1 keV).

A beam having low chromatic aberration can be produced using the system described in U.S. Pat. No. 7,034,315 to Henstra et al. (Henstra), which is assigned to the assignee of the present invention and which is hereby incorporated by reference. Applicants have found that by combining the system of Henstra with the known technique of beam deceleration, a low energy, low aberration beam can be produced. Such a beam is useful for controlling beam chemistry processes. The system of Henstra also provides for very fast blanking, which allows control of adsorbate depletion effects.

The system of Henstra also provides two levels of beam current, so that a high beam current is available for operations that do not require the high resolution available at the lower beam currents. The SEM objective lens can be used for slow focus corrections that may be needed for the fabrication of high aspect ratio structures, as the depth of the etch pit or the height of a deposited structure increases during processing, changing the distance from the objective lens to the sample surface.

In the system of Henstra, the electron beam is split into two beams, one that travels eccentrically through the lens, and one that travels through the center of the lens. A user can select either beam—selecting the beam passing eccentrically provides a beam having low chromatic aberration, whereas selecting the beam passing through the center of the lens provides a beam typically having a greater current.

FIG. 1 schematically shows, in cross-section, a particle source according to the invention. A particle-emitting surface, such as the electron-emitting surface 1 of a field emission source of electrons, is located on an optical axis 2. The beam of electrons 11 emergent from the electron-emitting surface 1 is sub-divided by a diaphragm 3—containing beam-limiting diaphragm openings in the form of round holes 4 and 5—into a central beam 12 and an eccentric beam 13. Both beams 12 and 13 are focused by a lens 6 placed on the optical axis 2. The electron-emitting surface 1 is imaged by the lens 6, so as to form image 14 via beam 12 and to form image 15 via beam 13. The energy-selecting diaphragm opening 9 is located in a diaphragm 7, in which diaphragm 7 a cut-out 8 is also made so as to allow the central beam 12 to pass. In the vicinity of the position where the beam 13 goes through the axis, a deflection unit 10 is placed, which deflects one of the beams (12, 13) about the optical axis 2.

The electron-emitting surface 1 emits electrons into the beam 11. This beam 11 illuminates both the diaphragm opening 4, which is located centrally about the optical axis 2, and the eccentrically located diaphragm opening 5. The diaphragm openings 4 and 5 are embodied as round cut-outs in diaphragm 3. In the case of a field emission source, this diaphragm 3 can also serve as an extraction electrode, whereby a voltage difference is, applied between the diaphragm 3 and the electron-emitting surface 1. The size of the diaphragm openings 4 and 5 determines the current in the beams 12 and 13. The eccentricity of the diaphragm opening 5 determines the energy dispersion of the eccentric beam 13.

The central beam 12 formed by the diaphragm opening 4 is focused by the lens 6, located about the optical axis 2, whereby an image 14 of the electron-emitting surface 1 is formed. Similarly, the eccentric beam 13 is focused, whereby an image 15 (the dispersion line) of the electron-emitting surface is formed.

The beam passes through deflectors 50 and is focused by objective lens 52 onto the sample 54. A voltage source 56 provides a potential difference between objective lens 52 and sample 54. Voltage source reduces the landing energy of electrons in the primary beam. This known technique allows the beam to travel through the column at a higher, energy with reduced dispersion, and then the beam energy is reduced as it approaches the sample. This reduces the electron interaction in the beam and therefore improves the resolution. As the electrons approach the sample, the electrons are slowed to a relatively low landing energy. Thus, the electron beam has low chromatic aberration and low landing energy, while avoiding beam spreading caused by diffraction and beam interaction. The low energy is useful for many processes, such as electron-beam induced deposition. Skilled persons will recognize that electron microscopes may include components in addition to those described above, or that one or more of the previously mentioned components are missing, or are placed in a different position relative to each other.

Using a low beam energy reduces the interaction volume, thereby providing finer control over the deposition or etch process. The low energy, low current beam also provides greater efficiency, so that fewer electrons are required to etch or deposit a unit volume of material, which can be a benefit for sensitive materials that can be damaged by the electrons.

Figure 2:
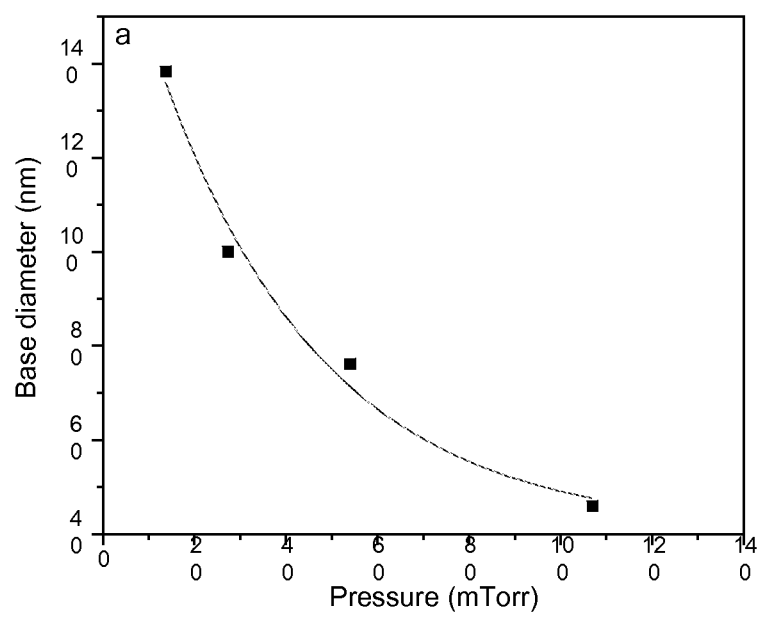
FIG. 2 is a graph of base diameter of a pillar grown by electron beam-induced deposition versus pressure of the gas precursor.

FIG. 2 is a graph showing the base diameter of pillars grown as a function of precursor pressure in the vacuum chamber, which is a related to the replenishment rate of precursor adsorbates consumed in the beam chemistry reaction. The pillars were grown using $WF_6$ precursor and a beam current of 1.2 nA and a growth time of 5 sec/deposit. FIG. 2 shows that as the precursor pressure increases, the base diameter of the pillar decreases. This is because the sample area under the beam is depleted of precursor adsorbates more severely at low pressures, which favors horizontal growth. When the precursor arrival rate is increased by increasing the precursor gas pressure, vertical growth is favored.

Figure 3:
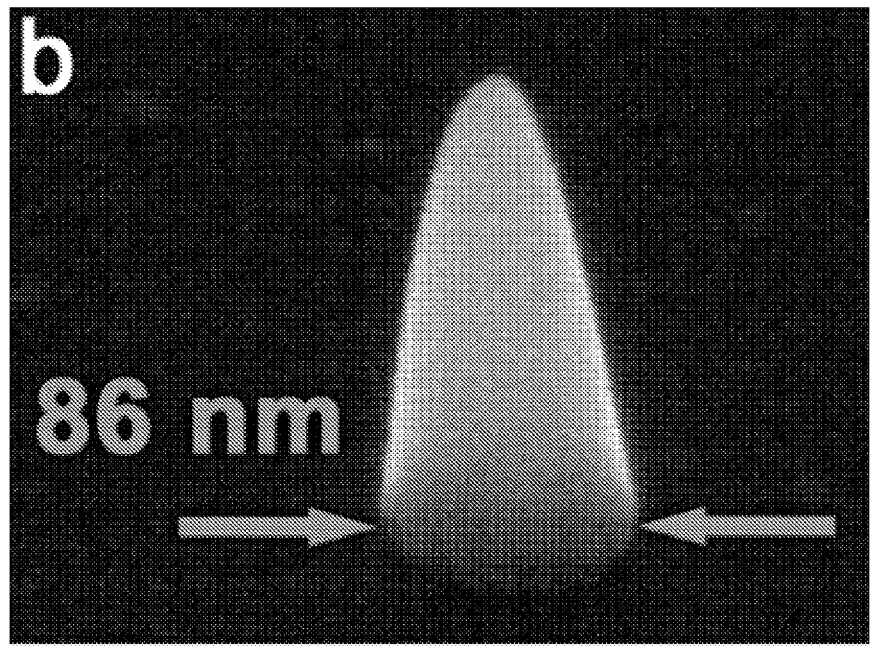
FIG. 3 shows a pillar grown by electron beam-induced deposition.
Figure 4:
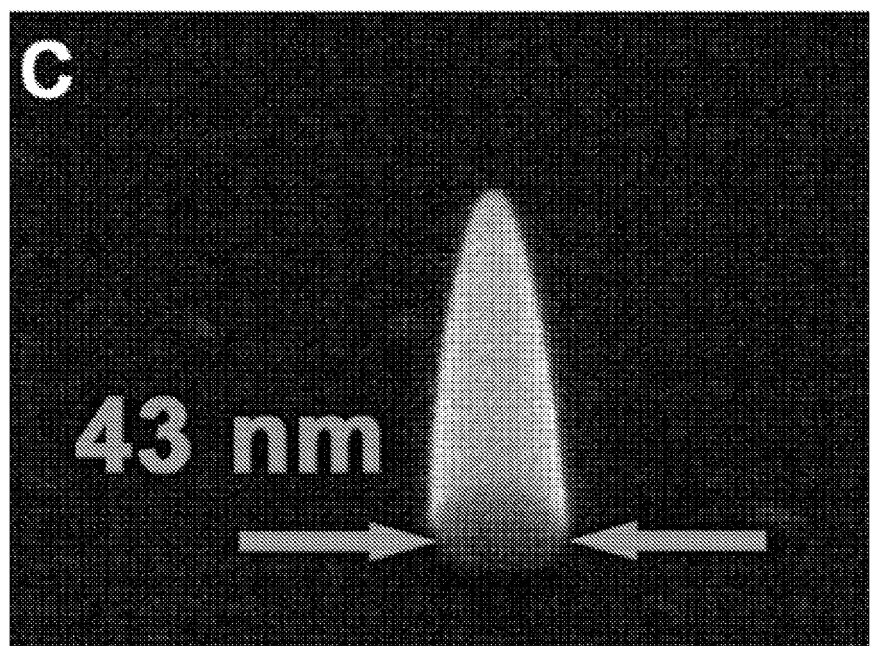
FIG. 4 shows a pillar grown by electron beam-induced deposition and using a lower beam current than that used to grow the pillar in FIG. 3

FIGS. 3 and 4 show images of pillars grown using a growth time of 2 sec/pillar with a $WF_6$ pressure of 13 mbar (10 mTorr). FIG. 3 show an electron image of a deposit 300 grown using a beam current of 1.1 nA and FIG. 4 shows an electron image of a deposit 400 grown using a beam current of 121 pA. FIGS. 3 and 4 show that pillar 300 is wider than pillar 200. The higher beam current used in creating the structure of FIG. 3 depletes precursor adsorbates directly under the beam more severely than at the deposit sidewalls, so increasing the beam current increases the horizontal growth to a greater extent than it increases the vertical growth rate. Conversely, an increase in precursor pressure (which serves to decrease D) has the opposite effect of preferentially increasing the vertical growth rate as shown in FIG. 2.

Figure 5:
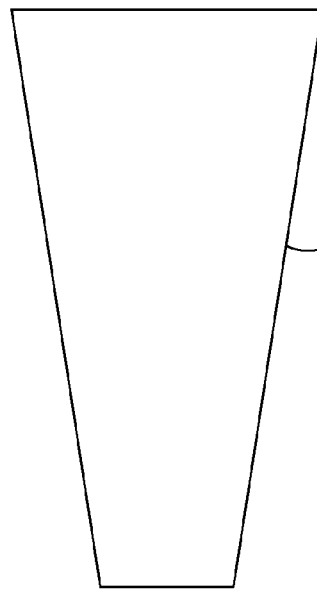
FIG. 5 shows schematically a pillar grown by increasing the beam current during growth.
Figure 6:
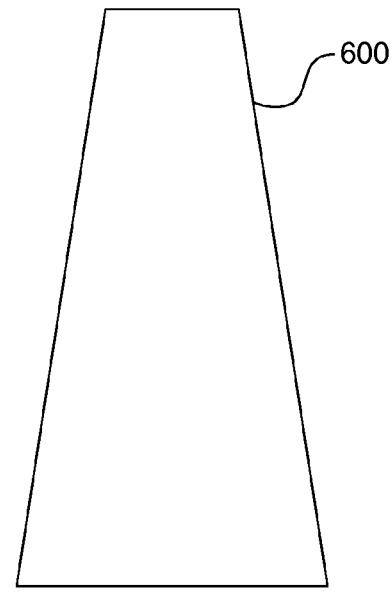
FIG. 6 shows schematically a pillar grown by decreasing the beam current during growth.
Figure 7:
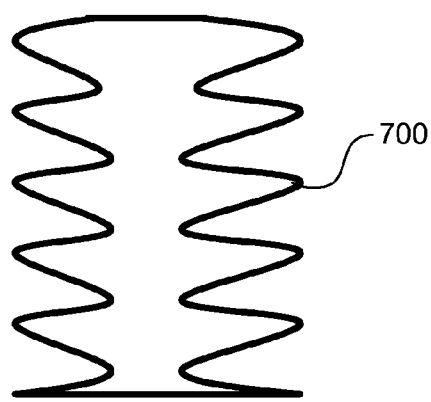
FIG. 7 shows schematically a pillar grown by repeatedly decreasing and increasing the beam current during growth.

FIGS. 5, 6, and 7 show schematic illustrations of structures that can be produced using electron-beam induced reactions and dynamic beam current control. The structures can be produced, for example, using a $WF_6$ pressure of about 13 mbar (about 10 mTorr) and a beam current varying between, for example, about 120 pA and about 1.2 nA. FIG. 5 shows a structure 500 having a diameter that increases with its height. Structure 500 can be constructed by increasing the beam current while depositing the structure, which will increase the horizontal growth rate faster than it will increase the vertical growth rate. For example, the current at the start of the growth may be about 120 pA, while the current at the end of the growth may be about 1.2 nA, while the pressure is maintained constant.

Similarly, the structure 600 shown in FIG. 6, which has a diameter that decreases as the height increases, can be produced by decreasing the beam current, for example, from 1.2 nA to 120 pA, while the structure is being produced, thereby favoring vertical growth as the height of the pillar increases. FIG. 7 shows a structure 700 having a diameter that oscillates as the structure grows. The structure of FIG. 7 can be grown by oscillating the beam current multiple times between 1.2 nA to 120 pA as the structure is grown.

Figure 8:
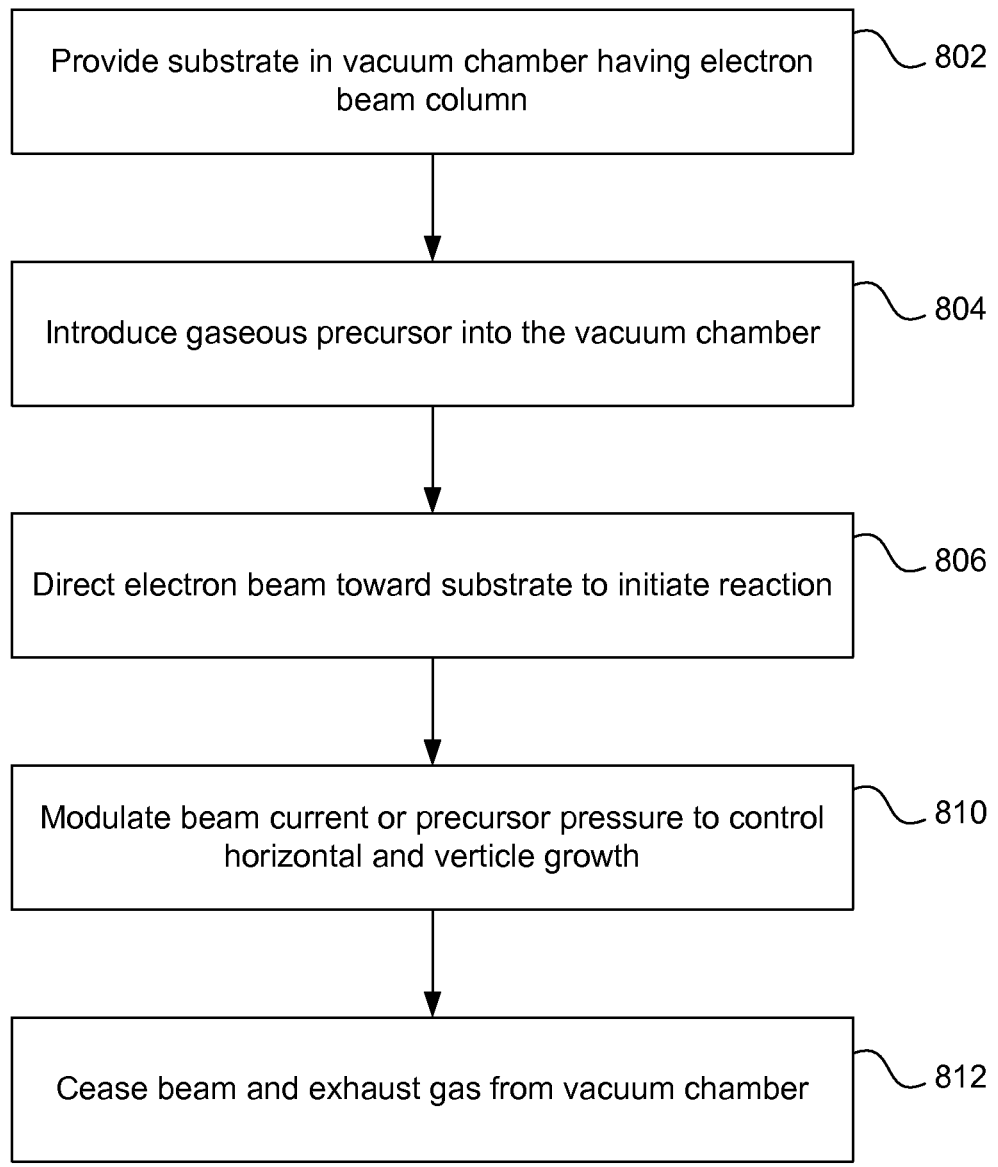
FIG. 8 is a flow chart showing the steps of a preferred embodiment of the present invention.

FIG. 8 shows a preferred method of the present invention. In step 802 a substrate is provided in a vacuum chamber including an electron beam column. In step 804, a gaseous precursor is introduced into the vacuum chamber. In step 806, the electron beam is directed toward the substrate in the presence of the precursor to initiate a reaction. In step 810, the current of the beam or the precursor pressure is modulated to control the ratio between horizontal and vertical growth. In preferred embodiments, the beam current is controlled by rapid blanking. For example, the current can be decreased to narrow the structure or increased to widen the structure as it is being formed. In step 812, the beam is removed and the gas exhausted from the vacuum chamber. While the examples above use $WF_6$ as a deposition precursor, any known deposition or etch precursor can be used. Many such precursors are known in the art. Etch precursors include, for example, $XeF_2$, Cl, $N_2O$ and $H_2O$. Deposition precursors include, for example, $(CH_3)_3CH_3C_5H_4Pt$ and $Pt(PF_3)_4$ (for depositing Pt-containing material), $W(CO)_6$ (for depositing W-containing material), $C_6H_5CH=CH_2$ (for depositing C-containing material), and $(HSiCH_3O)_4$ (for depositing C-doped $SiO_x$)

While a relatively constant beam current passes through a current limiting aperture in the electron beam column, the beam current is modulated by rapidly blanking and unblanking it. The beam current is controlled by changing the duty cycle (d) defined as d=t/T, where T is the duration of one blank/unblank cycle, and t is the time during which the beam is active (i.e., unblanked) per cycle. Hence, d is the fraction of the current arriving at the sample surface. In general, it is desirable to enable a maximum beam current reduction of at least one order of magnitude (i.e., a duty cycle of $10^{-1}$). The corresponding values of t and T are determined by the beam current and the number of electrons on average delivered to the sample per cycle. For example, if the beam current in the absence of blanking equals 1 nA, then the values [d=$10^{-1}$, t=1.6 ns and T=16 ns] corresponds on average to 1 electron per pulse and a beam current of 100 pA at the sample surface. The value of t determines beam current continuity and granularity of the beam current control. Continuity and granularity degrade when each pulse delivers (on average) more than one electron to the sample. The above values of d and t are appropriate, for example, when using $WF_6$ as a deposition precursor at a pressure of about 13 mbar (about 10 mTorr), and a beam current (in the absence of blanking) of 1 nA. However, the extent of precursor adsorbate depletion at the sample surface is a strong function of the precursor species and pressure and the beam current used for beam chemistry. The duty cycle is preferably very small, that is, a very small, high frequency "beam ON" pulse per blank/unblank cycle. A very small duty cycle (whereby d approaches zero) corresponds to a very large beam current reduction. It is relatively easy to increase a very small d to increase then beam current, but more difficult to decrease it further. For the same reason, a small value of t is desirable. Hence, in a generic beam chemistry system, the minimum value of d should preferably be about $10^{-2}$, more preferably about $10^{-3}$ and more preferably still about $10^{-4}$. Similarly, in a generic beam chemistry system, the minimum value of t should preferably be about $10^{-1}$ ns, more preferably about $10^{-2}$ ns and more preferably still about $10^{-3}$ ns. The periods in which the beam is on and then off are typically very short compared to the processing time, which is typically on the order of seconds. In other words, the minimum duty cycle is preferably smaller than about $10^{-2}$, more preferably smaller than about $10^{-3}$ and most preferably smaller than about $10^{-4}$ and t is preferably smaller than about $10^{-1}$ ns, more preferably smaller than about $10^{-2}$ ns and most preferably smaller than about $10^{-3}$ ns.

While FIG. 2 shows that the relative growth rate in the horizontal and vertical directions can also be controlled by controlling the adsorbate pressure, the pressure cannot be altered as quickly as the beam current. Furthermore, electron beam scatter in the gas increases with pressure. It is therefore desirable to minimize the gas pressure in order to minimize electron-gas scattering above the sample surface.

The system of Henstra provides for quick switching between high and low beam current. Under some circumstances, a high beam current will etch the underlying material while a lower beam current will result in deposition (see, for example, Toth et al., J. Appl. Phys. 101, 054309, 2007; and Lobo et al., Nanotechnology 19, 025303, 2008). Thus, a user can switch readily between etching and deposition.

In another embodiment of the invention, the electron beam induced deposition is performed with the sample cooled below room temperature, which increases the precursor residence time at the sample surface, thereby reducing the gas pressure needed for processing. The reduced gas pressure reduces scattering of the primary beam, allowing lower beam energies to be used. The lower energy electrons have a smaller interaction volume within the sample. Hence, overspray is reduced both because of reduced electron-gas scattering, and because reflected and secondary electrons come only from a volume that is closer to the beam impact point at the sample surface. In the extreme case of a very low sample temperature, such as that achieved by liquid nitrogen cooling of the sample, many precursors condense onto the sample surface, and the gas inside the SEM chamber can be evacuated prior to electron beam processing. This is advantageous in that it essentially eliminates scattering of the primary beam by gas molecules during electron beam processing.

Figure 9:
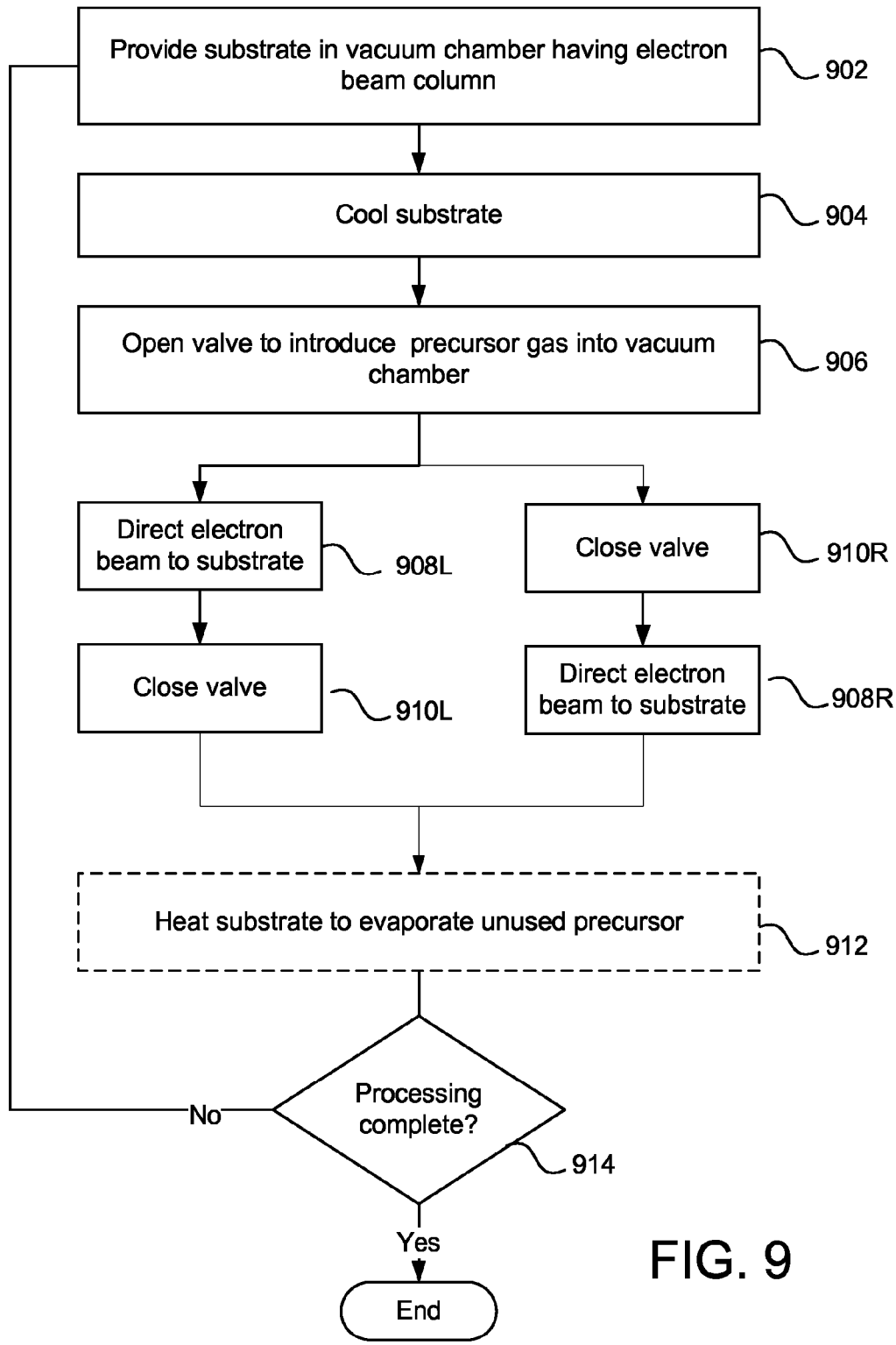
FIG. 9 is a flow chart showing the steps of another preferred embodiment of the present invention.

FIG. 9 shows the steps of a preferred method. In step 902, a substrate is provided in a vacuum chamber including an electron beam column. In step 904, the substrate is cooled, for example, to between about −10° C. and about −150° C. In step 906, a valve is opened to allow a small amount of precursor gas to flow to the work piece. At cool work piece temperatures, multiple layer of molecules can adhere to the work piece. An electron beam is then directed to the substrate to react the molecules on the substrate. The electron beam can be directed to the substrate either while the gas is flowing, or after the gas has condensed onto the substrate. The left branch of the flowchart shows that in step 908L, the electron beam is directed toward the substrate as the gas is flowing, and then the gas valve is closed in step 910L. Alternatively, as shown in the right branch of the flow chart, the valve is closed in step 910R and then the electron beam is directed toward the substrate in step 908R. Closing the valve reduces the gas pressure and therefore reduces scattering of the electron beam. In optional step 912, the substrate is briefly heated, for example by resistance heating, to evaporate the unreacted precursor from regions that were not addressed by the beam. In decision block 914, a decision is made as to whether processing is complete. The process is not yet complete, the process continues with step 904. The temperature used depends on the vapor pressure of the precursor. Most known precursors have low vapor pressures between temperatures of between about −10° C. and about −150° C.

Another aspect of the invention is the provision of an electron beam having a low chromatic aberration and low energy electron beam that provides improved resolution in various electron beam applications. The low chromatic aberration is provided as described in Henstra, while the low energy is achieved by applying a voltage to the sample to decelerate the objective lens and the sample allows the maintenance of a high beam energy in the majority of the electron column reduces spreading of the beam caused by the mutual repulsion of the electrons in the beam.

Reducing the energy of the primary beam reduces the penetration depth of the electrons, thereby shrinking the interaction area from which the secondary electrons emerge from the surface and improves resolution. Low beam energy, however, typically causes the beam to spread out more in the electron column, thereby increasing the beam spot size on impact and decreasing resolution. This is caused in part because the charged particles in the beam repel each other, and at low beam energies, the particles take more time to traverse the column and the repulsive force operates for a longer period of time on the beam, spreading the particles further apart. By having the electrons traverse the column at relatively high energy and then lose energy as they approach the sample, high resolution is maintained at low beam energies.

While the examples above use an electron beam, other types of beams, such as a focused ion beam, could also be used. Instruments using a focused ion beam, or even a focused ion beam and a focused electron beam, are known to the skilled person per se.

When using, for example, a focused ion beam, the impinging ions cause the formation of secondary electrons. These secondary electrons are thought to be responsible for the beam induced deposition (also known as ion beam induced deposition or IBID, as opposed to the earlier described electron-beam induced deposition or EBID) or beam induced etching. Again, lateral process resolution is limited by electron emission from sidewalls, which is affected by the size of the interaction volume.

Applicants believe that adsorbate depletion control ultimately yield superior resolution for ion beam-induced processing.

It is noted that in EBID a low energy of the impinging electron beam is preferred to minimize the interaction volume. For ions this is not, or to a much lesser degree, the case, as the range of ions in matter is much less than the range of electrons. Also, the before mentioned back-scattered electron are not formed. Therefore the energy of ions used for IBID and -etching is typically higher than the energy of electrons used for high resolution EBID.

For an apparatus using ions again "conjugate blanking" techniques are preferred, especially as the transit time of the ions through the blanking plates of a blanker is much longer than the transit time of electrons in such a blanker.

It is mentioned that modern instruments equipped with a scanning electron microscope column, a focused ion beam column, or both, are typically equipped with a controller controlling the deflection unit(s) for position the beam(s) upon the sample. As a result this controller controls the time that the beam dwells on one spot. In an aspect of the invention this controller also controls the duty cycle of the beam by controlling the one or more beam blanker used to control the duty cycle.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of producing a microscopic structure, comprising:
    directing a precursor gas toward a substrate; and
    directing an particle beam toward the substrate to initiate a reaction with the precursor gas;
    controlling the beam current during processing by controlling the duty cycle of the beam by blanking and unblanking the beam to control the depletion of the adsorbed precursor gas to etch or to deposit a material
    in which the particle beam is a beam of electrons or a beam of ions; and in which the particle beam is focused on the substrate using a lens, and the substrate is biased with respect to said lens so that the energy of the particle beam is reduced to less than 1000 eV as the beam approaches the substrate.

2. The method of claim 1 in which controlling the beam current during processing by controlling the duty cycle of the beam by blanking and unblanking the beam includes reducing the beam current by at least one order of magnitude.

3. The method of claim 2 in which the time during which the electron beam is unblanked per blank/unblank cycle is smaller than or equal to 1 ns.

4. The method of claim 1 in which rapidly blanking and unblanking the electron beam includes changing the duty cycle to change the beam current and the dimension of the microscopic structure while it is being formed, including reducing the duty cycle to increase the ratio of vertical growth to horizontal grown of the microscopic structure or increasing the duty cycle to decrease the ratio of vertical growth to horizontal growth of the microscopic structure.

5. The method of claim 1 in which the substrate is cooled to increase the precursor adsorbate residence time on the substrate surface.

6. A particle-optical apparatus for forming fine structures on a substrate, the particle-optical apparatus comprising:
   a particle source for producing a beam of particles, in which the particle source is an electron source and the beam of particles is a beam of electrons or the particle source is an ion source and the beam of particles is a beam of ions;
   one or more particle-optical lenses for focusing the beam of particles on a substrate;
   a deflector unit for positioning the beam of particles on the substrate;
   a beam blanker for blanking the particle beam; and
   a programmable controller for controlling at least the deflector unit and the beam blanker;
   the programmable controller is programmed to reduce the average current of the particle beam by blanking/unblanking the particle beam with a cycle time less than the time that the beam is positioned at one position on the substrate; and
   the programmable controller is further programmed to bias the substrate with respect to said lens so that the energy of the particle beam is reduced to less than 1000 eV as the beam approaches the substrate.

7. The particle-optical apparatus of claim 6 in which the controller controls the blanker such, that the time during which the beam is unblanked per blank/unblank cycle is smaller than or equal to 1 ns.

8. Software carrier having stored thereon program code for programming the programmable controller of the apparatus of claim 6 to reduced the average current of the particle beam by blanking/unblanking the particle beam with a cycle time less than the time that the beam is positioned at one position on the substrate.

* * * * *